United States Patent [19]

Lewiner et al.

[11] Patent Number: 4,737,768

[45] Date of Patent: Apr. 12, 1988

[54] ELECTRONIC IDENTIFICATION ASSEMBLIES OF CAPACITIVE KEYBOARDS

[76] Inventors: Jacques Lewiner, 5 rue Bory d'Arnex, 92210 Saint Cloud; Claude Hennion, 14 rue de la Glacière, 75013 Paris, both of France

[21] Appl. No.: 857,065

[22] Filed: Apr. 29, 1986

[30] Foreign Application Priority Data

May 2, 1985 [FR] France ................................. 85 06666

[51] Int. Cl.$^4$ ............................................. G08C 9/02
[52] U.S. Cl. ............................... 340/365 S; 340/365 C
[58] Field of Search ............ 340/365 S, 365 R, 365 C; 178/17 C; 200/DIG. 1

[56] References Cited

U.S. PATENT DOCUMENTS

| T904,008 | 11/1972 | Crouse ........................... 340/365 C |
| 4,405,917 | 9/1983 | Chai ............................... 340/365 C |
| 4,405,918 | 9/1983 | Wall et al. ....................... 340/365 C |
| 4,481,587 | 11/1984 | Daniels .......................... 340/365 VL |

Primary Examiner—John W. Caldwell, Sr.
Assistant Examiner—Tyrone Queen
Attorney, Agent, or Firm—Larson and Taylor

[57] ABSTRACT

An electronic assembly is provided associated with a capacitive keyboard for identifying the depressed keys of this keyboard, which keys are disposed at the intersection points of a checkerboard pattern formed of m lines and n columns, comprising means for successively applying to the inputs of the m lines trains of n successive identical pulses, means for successively collecting at the outputs of the n columns the signals created by these pulses and means for detecting and identifying, among the signals collected, the echoes which exceed a predetermined threshold and which correspond to depressed keys, which means comprise a comparator for comparing the amplitude of said signals with that of a reference voltage. At all times, the comparison reference is related to the average in time of the mean of the amplitudes of the signals received at least two of the column outputs.

7 Claims, 1 Drawing Sheet

ELECTRONIC IDENTIFICATION ASSEMBLIES OF CAPACITIVE KEYBOARDS

BACKGROUND OF THE INVENTION

The invention relates to the electronic assemblies associated with capacitive keyboards for identifying the keys which are depressed on these keyboards.

More precisely, it relates to the assemblies of the above mentioned kind for reading out, with a view to the subsequent use thereof, the information elaborated i.e., outputted by means of keyboards comprising a plurality of keys of the capacitive type distributed in a matrix arrangement i.e. disposed at the intersection points of a checkerboard pattern formed of m lines and n columns, m and n being whole numbers generally between 8 and 16.

In the keyboards in question, each key is associated with a capacitor and depression thereof results in a considerable variation of the capacity of this capacitor.

The two electrodes of each capacitor corresponding to the line i and to the column j (i being a whole number between 1 and m and j being a whole number between 1 and n) are connected respectively, the first one to the first electrodes of the other capacitors of line i and the second one to the second electrodes of the other capacitors of column j.

Depression of the key associated with such a capacitor then results in "capacitively coupling" line i and column j together.

For identifying each key depressed in such a keyboard, means are provided for successively applying to the inputs of the m lines trains of n successive identical pulses spaced apart mutually in time by identical times t, means for successively collecting at the outputs of the n columns the signals created by the above pulses, the n outputs being for this scanned successively at timing t and this scanning being renewed m times in succession, and means for detecting and identifying, among the signals collected, the echoes which exceed a predetermined threshold and which correspond to depressed keys.

If only the key corresonding to line i and to column j of the keyboard is depressed at a given moment, the only echo detected and identified by the above described exploration corresponds to the pulse of rank j of the train of rank i.

The identification assemblies of the above kind are satisfactory when the capacitor variations of the capacitors associated with the keys are sufficiently large with respect to the parasite coupling capacitances existing between the lines and the columns.

But this is no longer the case when these parasite capacitances are relatively high to the extent of being of the same order of size as the variations considered, said capacitances and variations being for example both of the order of 10 pF.

In such a case, in fact, the above described identification echoes, which correspond to keys of the keyboard actually depressed at a given time, do not differ sufficiently from the parasite signals created at the same time at the level of some at least of the keys which are not depressed.

It then becomes hazardous to entrust to the collecting means the mission of identifying the echoes without any other precaution.

These means are in fact sensitive only to the high or low logic levels of the electric signals representative of these echoes and not to the true amplitudes of said signals.

To overcome this drawback, it has already been proposed to adjust the detection level of the signals in question by comparing each of them, in an appropriate comparator, to a reference voltage determined as a function of the characteristics of the keyboard, during manufacture thereof; said signals and said reference are received respectively at the two inputs of the comparator and only the signals are selected whose amplitude exceeds that of the reference.

These assemblies form an improvement but do not give satisfaction in all cases.

In fact, the value of the reference is determined therein once and for all and does not remain ideal or even appropriate in all circumstances. Thus, some external parasites, particularly of the electromagnetic types, may simultaneously affect the state of the whole of the keys of the keyboard to the extent of unduly increasing at a given time the output signal collected from the column worked at that time and of causing this signal to be interrupted as corresponding to a depressed key even if none of the keys of this column has been depressed at that time.

To overcome this drawback, it has already been proposed to adjust the compensation reference at all times as a function of the actual state at that time of the different keys forming at least two columns of the keyboard and, for this, to give to said reference an amplitude M related to the mean of the amplitudes of the signals collected at said time from said columns.

This method forms an improvement with respect to the preceding one for the case where it is desired to protect the keyboard from relatively intense parasites of short duration.

But is does not allow certain troubles to be compensated for such as the one resulting from a plurality of keys of the keyboard disposed in the same line being held simultaneously depressed.

In fact, in such a case, the mean M of the amplitudes of the signals collected at the different columns corresponding to these keys itself varies at the timing of the pulses applied to the line considered and it may happen that a useful signal intended for identifying the depression of a key of another line no longer differs itself sufficiently from the reference M elaborated at the same time for being truly identified as "useful".

The invention overcomes this drawback and others of the same kind.

SUMMARY OF THE INVENTION

For this, in accordance with the invention, the electronic identification assemblies of the above kind are essentially characterized in that they comprise means for giving to the amplitude of the reference at all times a value T which is an average in time of the mean amplitude M.

In such a case, in practically all situations, the amplitude of each useful signal remains substantially greater than that of the reference T elaborated at the same time as the signal and is therefore correctly identified.

The duration D adopted for the average in time is preferably between 0.2 and 5 B, B being the scanning time of the columns which come into play for the elaboration of the amplitude mean M.

In practice, this duration D is between 5 and 200 ms and preferably between 50 and 150 ms.

In preferred embodiments, recourse is further had to one and/or other of the following arrangements:

the means for working out the average T in time of the amplitude mean M comprise an integration capacitor connecting the second input to the comparator to ground, the identification assembly comprises on the one hand an electric return resistance associated with a second input of the comparator and on the other hand an electric weighting resistance directly interposed between this second input and each of the column outputs used for elaborating the amplitude mean M, in the case where the numbers of keys of the keyboard corresponding to the different columns are identical, the electric weighting resistances connected to the outputs of the endmost columns of the keyboard differ from those connected to the outputs of the other columns.

Apart from these main arrangements, the invention comprises certain other arrangements which are preferably used at the same time and which will be more explicitly discussed hereafter.

BRIEF DESCRIPTION OF THE DRAWINGS

The following description made with reference to the accompanying drawings gives further details concerning the foregoing by way of illustration and in no wise limitatively.

DESCRIPTION OF THE PREFERRED EMBODIMENT

Figure 1:
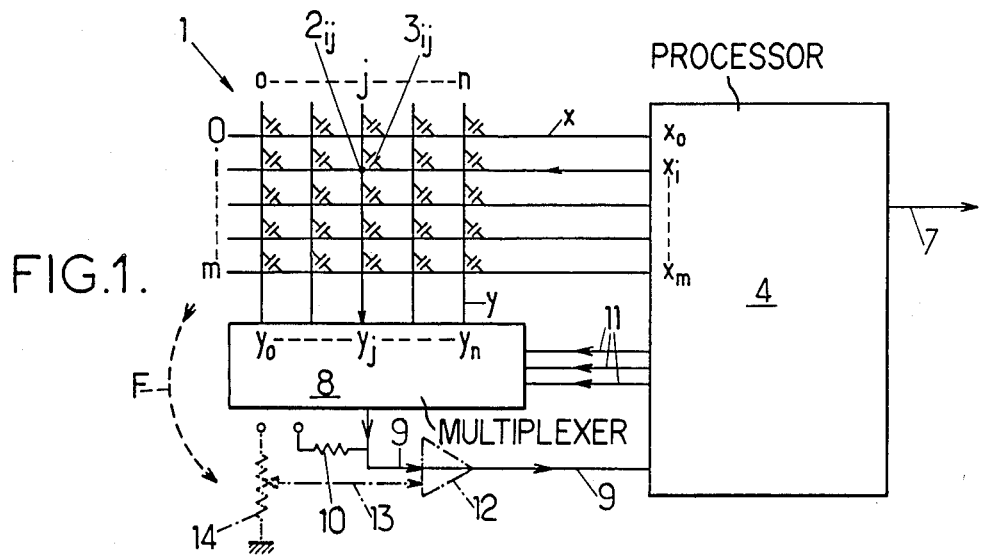
FIG. 1 of these drawings is a diagram of a known electronic identification circuit for a capacitive keyboard.

Keyboard 1 to be used comprises m×n keys 2 distributed in m lines and n columns.

Each key $2_{ij}$ corresponding to the line of rank i and to the column of rank j works by capacitive effect in that it is associated with a capacitor $3_{ij}$ whose capacity is very low when the key is not depressed and becomes relatively high as soon as this key is depressed or conversely.

The first electrode of each capacitor $3_{ij}$ is connected to the first electrodes of the capacitors associated with the keys of the same line of rank i by a conductor $x_i$ and the second electrode of said capacitor $3_{ij}$ is connected to the second electrodes of the capacitors associated with the same column of rank j by a conductor $y_j$.

For identifying the key $2_{ij}$ depressed, a processor or highly developed logic circuit 4 is provided arranged so as:

on the one hand, to send successively to the inputs of the m conductors x as many trains of n pulses 5 (FIG. 2) spaced regularly in by time periods or intervals t, and, on the other hand, to collect successively at the outputs of the n conductors y the signals created at these outputs in response to said pulses, such collection being effected at the timing t and renewed m times.

The overall scanning of the keyboard thus achieved is then renewed during the whole operating time thereof.

If key $2_{ij}$ is depressed at a given time, conductor $x_i$ is coupled capacitively to column $y_j$ and the overall scanning considered results in the creation of an echo 6 at the output of said column in response to the application, at the input of line $x_i$, of the pulse of rank j of the pulse train of rank i; in other words, this echo corresponds to the pulse of rank $n(i-1)+j$ of the complete train sequence used for each scanning.

The echo 6 thus collected and identified by appropriate coding is fed to a use device, particularly for displaying or printing in the way shown schematically by arrow 7.

In FIG. 1, the whole of the outputs of the columns have been grouped together in a multiplexer 8, which simplifies the return to the processor 4, this return being provided by means of a single conductor 9, itself connected to the supply potential of the circuit through a resistor 10.

In such a case, a multiple connection 11 is provided between the processor 4 and the multiplexer 8 for controlling and synchronizing the successive readouts of the outputs of the columns with the emission of pulses 5.

The first known improvement which was mentioned above and which uses a fixed reference voltage has been shown schematically with a dash dot line in FIG. 1.

It uses a comparator 12, formed preferably by an operational amplifier, whose two inputs are connected respectively to the above capacitor 9 and to a conductor 13 itself brought to a reference potential and this reference potential is adjusted once and for all by means of a voltage divider 14 connected between the supply potential of the circuit and ground.

The second known improvement mentioned above is tantamount to applying to the second input of the comparator a reference voltage which is no longer adjusted once and for all but compensates automatically for certain parasites applied to the whole of the keyboard.

For this, the reference in question is formed from signals collected at the outputs of at least two of the columns: the amplitude of this reference is given a value M corresponding to the mean of the amplitudes of these signals.

This is what has been shown schematically by the arrow F in FIG. 1.

The direct adoption of said amplitudes mean M as reference has the following drawback: this mean may itself be variable at the above timing t and so have maximum amplitudes at the times of detecting the echoes or useful signals, with the risk in some cases of letting such echoes pass without identification, in particular when they are formed with amplitude reduction, for example because of the undesirable presence of dust in line with the key concerned.

To overcome this drawback, in accordance with the invention, it is not the above defined amplitude mean M which is adopted as reference but an average T in time of this amplitude mean.

The duration D chosen for obtaining this average in time is preferably between 0.2 B and 5 B, if B designates the time required for scanning the columns coming into play for the elaboration of the mean M.

In practice, this duration is between 5 and 200 ms and preferably between 50 and 150 ms.

Figure 2:
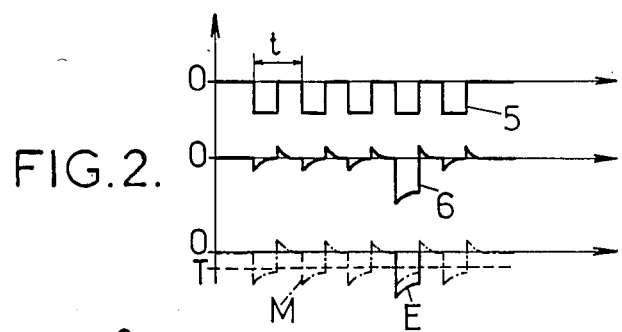
FIG. 2 shows three explanatory curves.

In the bottom portion of FIG. 2, the mean M has been shown with dot dash lines in the unfavorable case mentioned above of several keys of the same line being held depressed: it can be seen that the amplitude of this average T is smaller than that of the peaks of this mean M, and so the risk of it being confused with that of the echos E to be detected in less than for these peaks.

Figure 3:
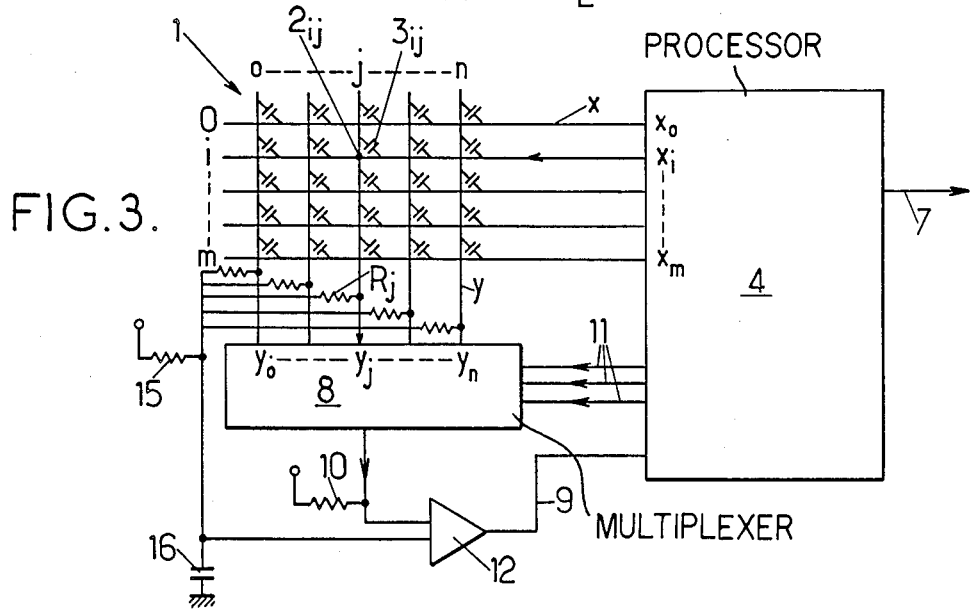
FIG. 3 is a diagram of a circuit of the above mentioned kind such as constructed in accordance with the invention.

In the embodiment of the invention which has been shown schematically in FIG. 3, the second input of the operational amplifier 12 is connected on the one hand to the supply potential of the circuit through a return resistor 15—whose value is chosen so as to permanently incorporate in the above average T any desirable DC voltage component—and on the other hand to each column output y through a weighting resistor $R_j$.

If the numbers and characteristics of the different keys corresponding to the different columns are the same, the weighting resistors $R_j$ may all be identical with each other or, in an interesting variant, they are identical with each other except for those corresponding to the two endmost columns of the keyboard, so as to take into account the environmental difference of these two endmost columns.

An integration capacitor 16 is provided between the second input of the operational amplifier 12 and ground for elaborating at all times the average T in time of the signal applied to said input during the above defined time D.

Thus, the reference voltage T applied to the second input of the operational amplifier 12 is constantly influenced by all the parasite capacitances which are in actual fact developed at the level of the couplings between the lines and columns of the keyboard, whatever the origin of these parasite capacities, and in particular whether they are due to permanent local deterioration or to at least one key other than that to be identified being held depressed for an extended period.

Following which, whatever the embodiment adopted electronic identification circuits are finally obtained for capacitive keyboards whose construction, operation and advantages follow sufficiently from what has gone before.

As is evident, and as it follows moreover from what has gone before, the invention is in no wise limited to those of its modes of application and embodiments which have been more especially considered; it embraces, on the contrary, all variants thereof.

What is claimed is:

1. An electronic assembly associated with a capacitive keyboard for identifying keys of this keyboard which have been depressed, said keys being distributed in a matrix arrangement so as to be disposed at intersection points of a checkerboard pattern formed of m lines and n columns, said assembly comprising means for successively applying to the inputs of the m lines trains of n successive identical pulses spaced apart mutually in time by identical time intervals t, means for successively collecting from the outputs of the n columns the signals created in response to said pulses including echoes produced when keys are depressed, the n outputs being for this purpose scanned successively at the time intervals t and this scanning being renewed m times in succession, means for detecting and identifying, among the collected signals, echoes which exceed a predetermined threshold and which correspond to depressed keys, comparator means, having a first input and a second input, for comparing the amplitude of said signals, received at said first input, with that of a reference voltage, received at said second input, and for selecting only the echoes whose amplitude exceeds that of the reference voltage, and means for automatically giving at all times to the reference voltge an amplitude related to the mean of the amplitudes of the signals outputted at that time at at least two of the outputs of the columns, said assembly further comprising averaging means for giving at all times to said amplitude of the reference voltage a value which is an average over a time period of said mean of the amplitudes of said signals.

2. The electronic assembly as claimed in claim 1, wherein the time period for said average is between 5 and 200 ms.

3. The electronic assembly as claimed in claim 1, wherein the averaging means comprises an integration capacitor connecting the second input of the comparator means to ground.

4. The electronic assembly as claimed in claim 1, further comprising a return resistance associated with the second input of the comparator means and a weighting resistance directly connected between the second input of the comparator means and each of the outputs of the columns used for establishing the amplitude mean.

5. The electronic assembly as claimed in claim 1, wherein the amplitude mean is established from the amplitudes of the signals outputted by all of the outputs of the columns of the keyboard.

6. The electronic assembly as claimed in claim 5, wherein weighting resistors are connected to the outputs of the columns and wherein the weighting resistors are identical with each other except for the weighting resistors connected to the columns of the keyboard at each end of the keyboard.

7. The electronic assembly as claimed in claim 2 wherein said time period is between 50 and 150 ms.

* * * * *